United States Patent [19]

Hiraoka

[11] Patent Number: 4,999,280
[45] Date of Patent: Mar. 12, 1991

[54] SPRAY SILYLATION OF PHOTORESIST IMAGES

[75] Inventor: Hiroyuki Hiraoka, Saratoga, Calif.

[73] Assignee: International Business Machines Corporation, Armonk, N.Y.

[21] Appl. No.: 324,849

[22] Filed: Mar. 17, 1989

[51] Int. Cl.$^5$ ............................................. G03F 7/40
[52] U.S. Cl. ................................. 430/330; 430/313; 430/323; 427/407.1
[58] Field of Search ............... 430/313, 314, 323, 330, 430/318; 427/407.1

[56] References Cited

U.S. PATENT DOCUMENTS

| 4,552,833 | 11/1985 | Ito et al. | 430/325 |
| 4,587,205 | 5/1986 | Harrah et al. | 430/326 |
| 4,599,243 | 7/1986 | Sachdev et al. | 430/314 |
| 4,678,688 | 7/1987 | Itoh et al. | 427/387 |
| 4,751,170 | 6/1988 | Mimura et al. | 430/296 |
| 4,770,974 | 9/1988 | Hiraoka | 430/270 |
| 4,770,977 | 9/1988 | Buiguez et al. | 430/313 |
| 4,782,008 | 11/1988 | Babich et al. | 430/313 |

FOREIGN PATENT DOCUMENTS

198215A2 3/1986 European Pat. Off. .

OTHER PUBLICATIONS

Chemical Abstracts 73(4): 15349b.

*Primary Examiner*—Marion E. McCamish
*Assistant Examiner*—Christopher D. RoDee
*Attorney, Agent, or Firm*—Joseph G. Walsh; Robert B. Martin

[57] ABSTRACT

Photoresist images are made resistant to reactive ion etching by treating them with a poly(dimethylsilazane).

9 Claims, No Drawings

SPRAY SILYLATION OF PHOTORESIST IMAGES

TECHNICAL FIELD

The present invention is concerned with a process for making photoresist images resistant to reactive ion etching.

BACKGROUND OF THE INVENTION

Photoresist images have been treated in the past to make them resistant to reactive ion etching. U.S. Pat. No. 4,552,833 shows a vapor phase reaction with hexamethyldisilazane following exposure to radiation. European Patent Application No. 86103208.4 shows the use of a monomeric silylaton agent dissolved in xylene or in the vapor phase. Such processes, however, require the use of a vacuum oven or a reaction bath, and often lead to swelling or cracking.

U.S. Pat. No. 4,587,205, (at Col. 10 Line 30), shows the spray coating onto a substrate of a polysilane positive photoresist material.

U.S. Pat. No. 4,678,688 shows the coating of a substrate surface with an organosilazane polymer.

U.S. Pat. No. 4,751,170 shows the use of ultraviolet rays to react an organic silane compound with an active polymer resist.

None of these references, however, shows the process steps of the present invention.

DISCLOSURE OF THE INVENTION

According to the present invention a photoresist image is made resistant to reactive ion etching by coating the image with a poly(dimethylsilazane), heating the coated image, and then rinsing with a solvent. The coating may be done by spraying, or by applying in a solvent, such as a hydrocarbon solvent. The process has the advantage of very great simplicity, and requires no vacuum oven or reaction bath. Furthermore, because the reaction is limited to a certain range of resist surfaces, no swelling or cracking appears. This is a great advantage over prior art monomeric silyation agents.

Poly(dimethylsilazane) may be used in a hydrocarbon solvent for silylation of resist images. The advantages of polymeric silylating agents are not only a simplified process, but also no swelling of resist images, because they silylate only surfaces of resist images. The silylation with monomeric agents often results in swelling of resist images, making it unsuitable for high resolution lithography.

The present invention is particularly useful with phenolic based photoresists. These are very well known in the art. They include, for example, phenol based resins such as novolacs, and poly(hydroxystyrene), made sensitive to radiation by the addition of sensitizers such as esters of 1-oxo-2-diazonaphthalene sulfonic acid.

Polysilazanes useful in the present invention are commercially available. They include, for example,
poly (1,1-dimethylsilazane) (PS112)
poly (1,2-dimethylsilazane) (MSX114)
poly (dimethylsilazane) with amino termination (MSX023), and the most preferred material, poly(dimethylsilazane) with methoxy termination (MSX022). The expressions PS112, MSX114, MSX023 and MSX022 are the code names for these materials, available from the Petrarch Systems, Bristol, Pa. Except for PS112, all these materials are oliomeric liquids. The methoxy terminated material has the lowest viscosity, and provides the best silylated resist surface with almost zero etch rate for 30 minutes of oxygen reactive ion etching.

The heating step of the present process can most conveniently be carried out simply by heating on a hot plate, for about half an hour, at a temperature of about 95° C. Preferred solvents include, for example, toluene and xylene.

Resist images were prepared coventionally. A polyimide layer with 2.5 $\mu$m thickness was spin-coated on a silicon substrate. On top of this polyimide film, sensitized novolac resist was spin-coated and baked at 85° C. for 10 minutes. The images were made by a contact printing with a conventional mask after development in aqueous alkali developer.

On top of resist images, the oligomeric liquid poly(dimethylsilazanes) were spray coated and placed on a hot plate at 95° C. for 30 minutes. After this heating, the wafers were rinsed with xylene for a short period, several seconds, and dried by a nitrogen stream.

The total film thickness of this bilayer consisted of 2.0 $\mu$m polyimide and 1.5 $\mu$m novolac resist. The film treated by the present reaction showed no thickness loss during 30 minutes of oxygen reactive ion etching, but the untreated film showed severe thickness loss.

While the preferred embodiments of the present invention have been illustrated, it should be apparent that modifications and adaptations to those embodiments may occur to one skilled in the art without departing from the scope of the present invention as set forth in the following claims.

What is claimed is:

1. A process for making a photoresist image resistant to reactive ion etching, said process comprising the steps of:
   i. coating the image with a poly(dimethylsilazane),
   ii. heating the coated image, and
   iii. rinsing the image with a solvent.
2. A process as claimed in claim 1 wherein the coating is applied by spraying.
3. A process as claimed in claim 1 wherein the coating is applied in a solvent.
4. A process as claimed in claim 1 wherein the photoresist is phenolic resin.
5. A process as claimed in claim 4 wherein the photoresist is a novolac resin.
6. A process as claimed in claim 4 wherein the photoresist is a poly(p-hydroxystyrene).
7. A process as claimed in claim 1 wherein the poly(dimethylsilazane) is an oligomeric liquid.
8. A process as claimed in 5 wherein the poly(dimethylsilazane) is methoxy terminated.
9. A process as claimed in claim 1 wherein the heating is for about half an hour at about 95° C.

* * * * *